United States Patent
Mayer

(10) Patent No.: US 7,307,845 B2
(45) Date of Patent: *Dec. 11, 2007

(54) MULTIPLE INTEGRATED CIRCUIT PACKAGE MODULE

(75) Inventor: David Mayer, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/228,874

(22) Filed: Sep. 15, 2005

(65) Prior Publication Data

US 2006/0028801 A1    Feb. 9, 2006

Related U.S. Application Data

(63) Continuation of application No. 10/384,993, filed on Mar. 10, 2003, now Pat. No. 6,972,958.

(51) Int. Cl.
*H01L 23/34* (2006.01)

(52) U.S. Cl. .............. 361/719; 361/709; 361/718; 257/719; 257/E23.08

(58) Field of Classification Search ............ 361/719, 361/785, 709, 718; 257/719, E23.08; 438/68
See application file for complete search history.

(56) References Cited

U.S. PATENT DOCUMENTS

| | | | |
|---|---|---|---|
| 4,092,697 A | 5/1978 | Spaight | |
| 4,750,086 A | 6/1988 | Mittal | |
| 4,879,629 A | 11/1989 | Tustaniwskyj et al. | |
| 4,997,032 A | 3/1991 | Danielson et al. | |
| 5,000,256 A | 3/1991 | Tousignant | |
| 5,014,161 A * | 5/1991 | Lee et al. | 361/709 |
| 5,175,613 A * | 12/1992 | Barker et al. | 257/713 |
| 5,290,193 A * | 3/1994 | Goff et al. | 439/331 |
| 5,323,292 A | 6/1994 | Brzezinski | |
| 5,357,404 A * | 10/1994 | Bright et al. | 361/818 |
| 5,602,719 A * | 2/1997 | Kinion | 361/704 |
| 5,608,610 A | 3/1997 | Brzezinski | |
| 5,625,944 A * | 5/1997 | Werther | 29/843 |
| 5,648,890 A | 7/1997 | Loo et al. | |
| 5,734,555 A * | 3/1998 | McMahon | 361/704 |
| 5,905,638 A * | 5/1999 | MacDonald et al. | 361/769 |
| 6,061,235 A | 5/2000 | Cromwell et al. | |
| 6,084,178 A * | 7/2000 | Cromwell | 174/35 R |
| 6,198,630 B1 * | 3/2001 | Cromwell | 361/704 |
| 6,347,946 B1 * | 2/2002 | Trobough et al. | 439/70 |

(Continued)

*Primary Examiner*—Evan Pert
*Assistant Examiner*—Victor A. Mandala, Jr.

(57) ABSTRACT

A multiple IC package module comprises a plurality of IC devices inserted in associated sockets mounted on a substrate. Each IC device has opposed, major surfaces, one of the major surfaces of each device confronting the socket into which the device is inserted. A compressible compliance layer is interposed between the one major surface of each IC device and the associated socket into which the IC device is inserted. The module further comprises a single heat sink having a surface in heat transfer relationship with the other of the major surfaces of the IC devices.

Also disclosed is an IC device package comprising an IC device including interconnect pins projecting from the device, a socket comprising contact receptacles for receiving the interconnect pins, and a compressible compliance layer interposed between the IC device and the socket, the interconnect pins projecting through the compliance layer and into the contact receptacles in the socket.

25 Claims, 4 Drawing Sheets

U.S. PATENT DOCUMENTS

| | | | |
|---|---|---|---|
| 6,362,516 B1 * | 3/2002 | Waters | 257/678 |
| 6,429,516 B1 * | 8/2002 | Tsunoi | 257/737 |
| 6,459,582 B1 * | 10/2002 | Ali et al. | 361/704 |
| 6,611,057 B2 * | 8/2003 | Mikubo et al. | 257/714 |
| 6,703,851 B1 * | 3/2004 | Howell | 324/754 |
| 6,712,621 B2 * | 3/2004 | Li et al. | 439/65 |
| 2001/0039138 A1 * | 11/2001 | Keller | 439/342 |
| 2002/0027773 A1 * | 3/2002 | Davidson | 361/763 |
| 2003/0168738 A1 * | 9/2003 | Kabadi et al. | 257/738 |

* cited by examiner

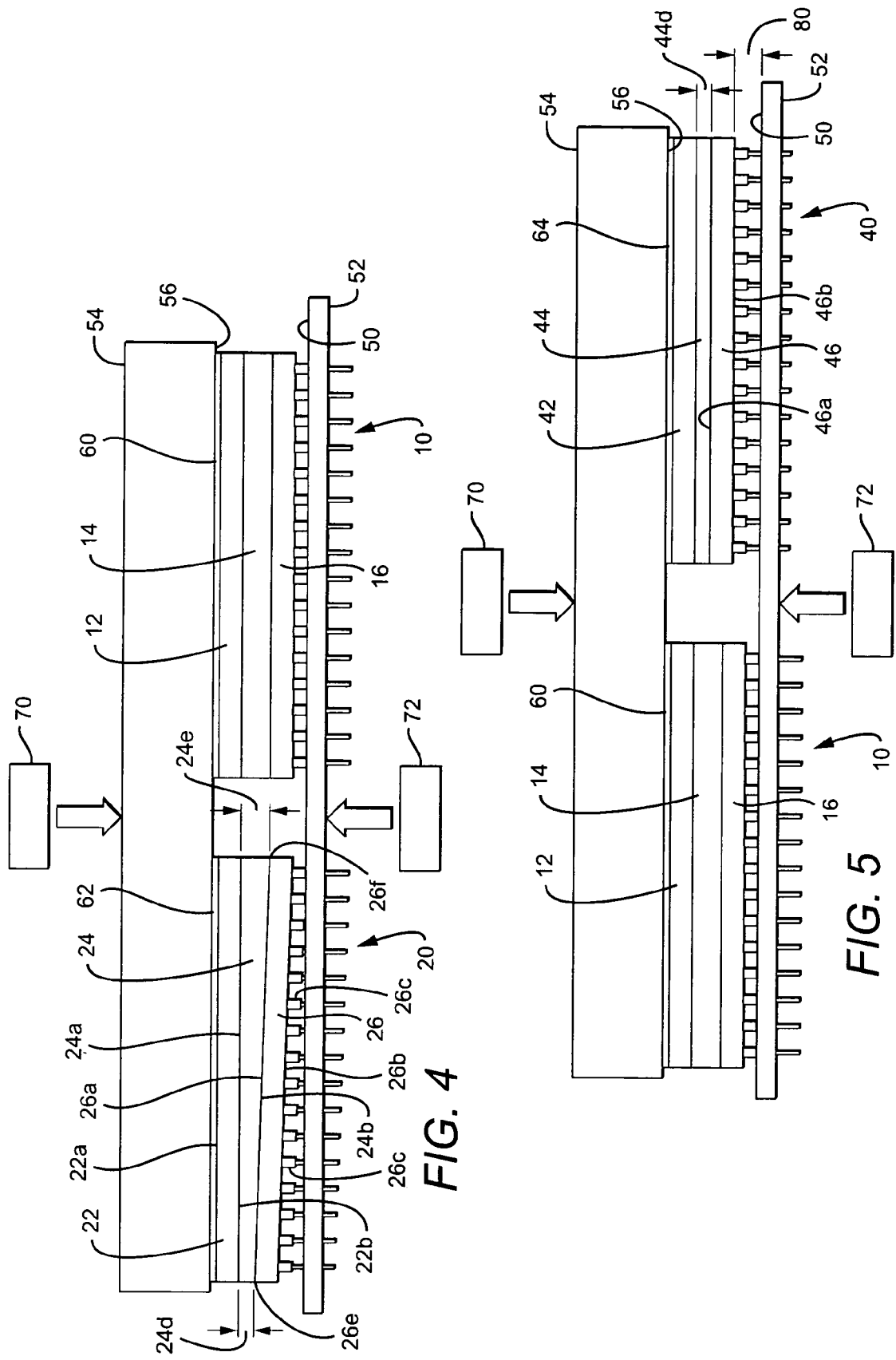

MULTIPLE INTEGRATED CIRCUIT PACKAGE MODULE

CROSS REFERENCE TO RELATED APPLICATION

This is a continuation of application Ser. No. 10/384,993 filed Mar. 10, 2003 now U.S. Pat. No. 6,972,958, titled MULTIPLE INTEGRATED CIRCUIT PACKAGE MODULE and hereby incorporated by reference herein.

FIELD OF THE INVENTION

The present invention relates generally to integrated circuit (IC) device packaging and particularly to multiple IC package modules.

BACKGROUND OF THE INVENTION

Electronic component modules containing multiple IC packages have come into common use. The IC devices contained within such packages often generate sufficient heat to require thermal management. The objective of thermal management in the design of electronic component packaging is to maintain the operating temperature of the active circuit or junction side of the devices low enough to prevent premature component failure. A typical approach to the thermal management of multiple IC packages is to utilize a single heat sink in heat transfer relationship with the upper surfaces of the module's IC packages for dissipating the heat generated into the ambient environment. A single heat sink common to all of the IC packages reduces the number of parts and space required as well as the cost of the module, and increases the total surface area available for transferring heat to the surroundings.

For high power IC devices such as microprocessors, large gate arrays and application-specific integrated circuits (ASICs) that generate significant amounts of thermal energy during operation, the use of a heat sink requires that a low thermal impedance interface exist between the upper surfaces of the IC packages and the heat sink. The efficiency of the thermal interface between the IC packages of a multi-package module and the associated single heat sink may be compromised, however, because of physical variations between the IC packages within the module. These variations are difficult, if not impossible, to avoid in a standard manufacturing process which allows for dimensional tolerances in each of the components of the package. In a package comprising stacked components, the tolerances are additive so that it is not unusual for there to be significant variations, for example, 0.015-0.020 inch, in the overall heights of the IC packages within a given module. These differences introduce non-coplanarities and gaps that can substantially reduce the efficiency of heat transfer across the heat sink/IC package interface.

Non-coplanarity of the upper surfaces of a module's multiple IC packages may also result from the particular interconnect system that is used. For example, although various interconnect options are available including those in which terminated IC devices are soldered to pads on a substrate, it is often advantageous to insert each IC device in a socket as opposed to permanently soldering it fast. In pin grid array (PGA) interconnect systems the socket is soldered to the substrate. The costly IC devices may thus be easily removed and upgraded, with the replaced IC device being salvageable. However, the process of attaching a socket to the substrate can result in slight deviations in the placement of the socket from a nominal position on the component surface of the substrate. For example, the soldered socket may be tilted relative to the substrate's component surface or, although parallel with the component surface, the socket may be soldered in a position that is somewhat higher than nominal. In any case, these positional deviations further contribute to the non-coplanarity of the upper, heat sink-confronting surfaces of the IC devices inserted in the sockets with a concomitant reduction in heat transfer efficiency.

Various approaches have been developed for addressing the problem of non-coplanarity of the upper surfaces of the IC packages in multiple IC package modules.

For example, in one approach, disclosed in U.S. Pat. Ser. No. 5,323,292 issued Jun. 21, 1994, to Brzezinski and assigned to the owner of the present invention, interposed between the multiple IC packages and an associated heat sink is a volume of liquid within a fluid-tight chamber. The volume of liquid interacts with a deformable membrane forming a wall of the chamber, the membrane being engaged by the non-coplanar surfaces of the multiple IC packages. The membrane serves as a conformal interface that compensates for variations in the heights and mounting angles of the IC devices within the package. Although providing a satisfactory solution, this approach tends to be complex and expensive.

Compensation for the non-coplanarity of multiple IC packages within a module has also been attempted by using a separate heat sink for each IC package. However, this expedient nullifies the many advantages, outlined earlier, of using a single heat sink.

In another known approach to the problem, a thick, compliant, thermally conductive layer is interposed between the upper surfaces of the IC devices and a single heat sink to compensate for device height variations. However, such thick interface materials provide very poor thermal performance compared to the highly efficient, thin interfaces mentioned above.

SUMMARY OF THE INVENTION

Accordingly, it is an overall object of the present invention to provide a multiple IC package module that compensates for differences in the heights and angles of the various packages, yet utilizes a single heat sink common to the packages without compromising the efficiency of the heat transfer interface between the packages and the heat sink.

In accordance with one specific, exemplary embodiment of the invention, there is provided a multiple IC package module comprising a plurality of IC devices inserted in associated sockets mounted on a substrate. Each IC device has opposed, major surfaces, one of the major surfaces of each device confronting the socket into which the device is inserted. A compressible compliance layer is interposed between the one major surface of each IC device and the associated socket into which the IC device is inserted. The module further comprises a single heat sink having a surface in heat transfer relationship with the other of the major surfaces of the IC devices.

While the invention has its greatest utility with a plurality of IC packages, that is, two or more packages, the invention may also be applied to a single IC package.

Accordingly, pursuant to another specific, exemplary embodiment of the invention, there is provided an IC device package comprising an IC device including interconnect pins projecting from the device, a socket comprising contact receptacles for receiving the interconnect pins, and a compressible compliance layer interposed between the IC device and the socket, the interconnect pins projecting through the compliance layer and into the contact receptacles in the socket.

BRIEF DESCRIPTION OF THE DRAWINGS

The foregoing and other objects, features and advantages of the invention will be evident to those skilled in the art from the detailed description, below, taken together with the accompanying drawings, in which:

FIG. 4 is a side elevation view of the module shown in FIG. 1 as seen along the line 4-4 thereof;

FIG. 5 is an end elevation view of the module of FIG. 1 as seen along the line 5-5 thereof;

DETAILED DESCRIPTION

In the following description, directional terms such as "upper", "lower", "top" and "bottom" are used only to facilitate the description of the invention; it will be apparent that the multi-IC package module of the invention can be oriented in any direction.

There have been developed thin thermal interfaces comprising single or multiple layer films of synthetic thermal grease, normally dry phase change thermal material, and the like, adapted to be interposed between the confronting surfaces of an IC device and a heat sink. When subjected to elevated temperatures, these materials liquify and fill the irregularities in those surfaces. The use of a thin thermal interface is highly desirable since it introduces only a small impedance to the flow of heat from the device to the heat sink. This advantage is lost, however, in the case of a multiple IC package module when the heat sink-confronting surfaces of the IC devices are even slightly non-coplanar and gaps are introduced between the thin interface and the adjoining surfaces.

Figure 1:
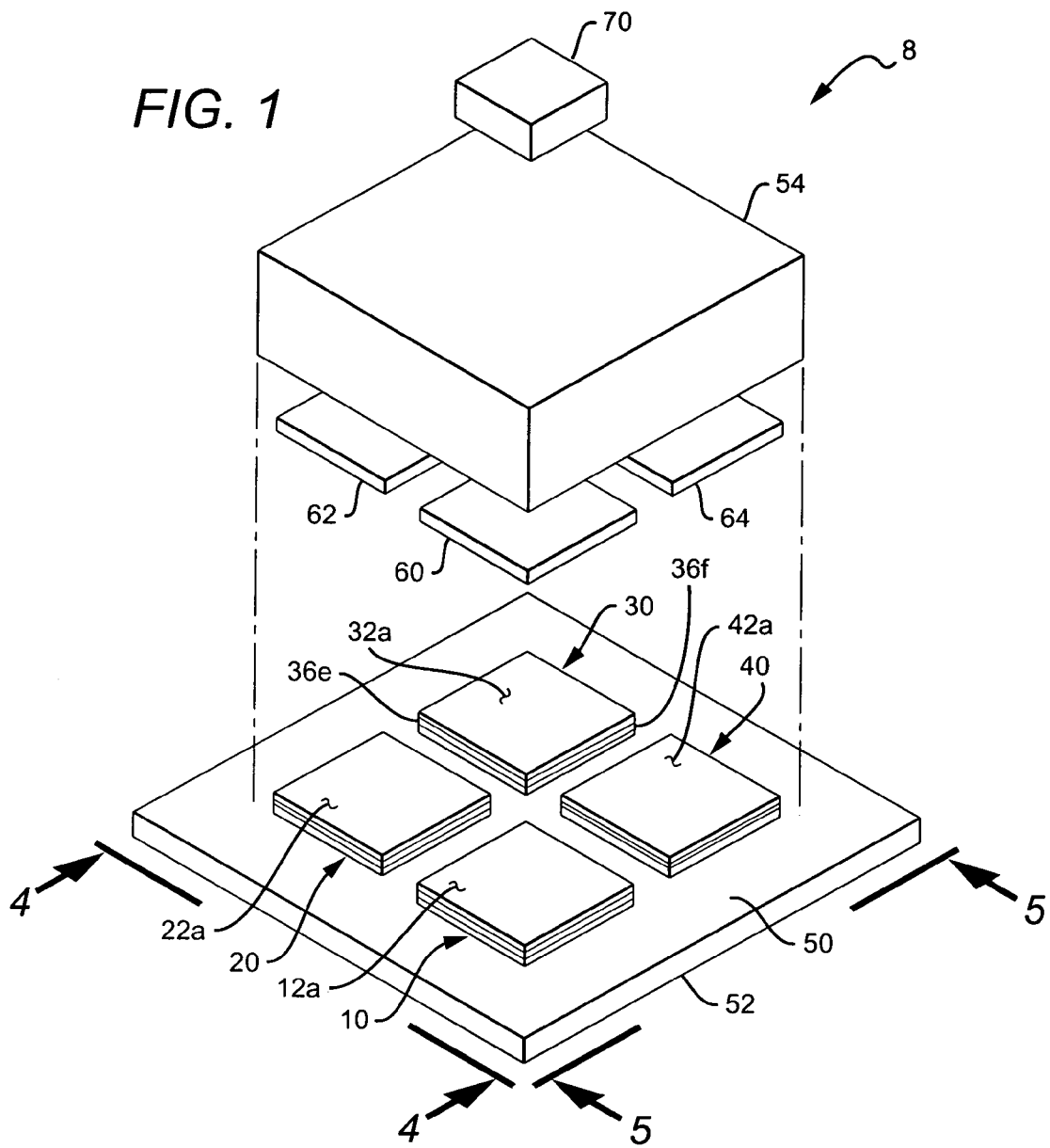
FIG. 1 is an exploded, perspective view of one specific, exemplary embodiment of a multiple IC package module in accordance with the invention.

Referring to FIG. 1, there is shown a multiple IC package module 8 in accordance with one embodiment of the present invention. Although the specific module depicted in FIG. 1 comprises four integrated circuit packages 10, 20, 30 and 40 arranged in a symmetrical, 2×2 grid pattern on a top or component surface 50 of a substrate 52, it will be evident that the invention is applicable to any number of IC packages arranged in any convenient manner on a substrate. Further, while the invention has its greatest utility with a plurality of IC packages, that is, two or more IC packages, it will be apparent that the invention may also be applied to a single IC package.

By way of example, the substrate 52 may comprise a printed circuit board such as a motherboard or other printed circuit assembly.

Each of the IC packages 10, 20, 30 and 40 comprises a series of stacked components. Taking the package 10 as representative and with reference now also to FIG. 2, these components include a heat-dissipating integrated circuit device 12, a compressible compliance layer 14 and a pin grid array (PGA) socket 16.

The IC device 12 may comprise, by way of example, a very large scale integration (VSLI) integrated circuit such as a CPU, a large gate array or an application specific integrated circuit (ASIC). The IC device 12 has a first or upper surface 12a and a second or lower surface 12b opposite the first surface. The upper surface 12a of the IC device also comprises the upper surface of the package 10. The IC device 12 may be of the PGA type and accordingly, projecting from the lower surface of the IC device is a plurality of pins 12c.

The compressible compliance layer 14 has, in its uncompressed state, parallel top and bottom surfaces 14a and 14b, respectively, and a plurality of apertures 14c through which the pins 12c of the IC device 12 are adapted to extend. The apertures 14c may be preformed in the compliance layer 14 or punched through the layer 14 by the pins 12c when the IC device 12 is inserted into the socket 16. The compliance layer 14 may comprise any of a variety of materials including, for example, an elastomeric, electrically insulative, low-creep material such as GR-S, NEOPRENE or rubber having an uncompressed thickness ranging, for example, from about 0.020 inch to about 0.050 inch. The compliance layer need not be heat conductive, thereby making available a wide range of inexpensive materials.

The PGA socket 16 has major, parallel, upper and lower surfaces 16a and 16b, respectively, and a plurality of pin-receiving contact receptacles 16c corresponding in number and position to the pins 12c of the IC device 12. As is known, a pin grid array interconnect system is characterized by Z-axis compliance in which a zero or low insertion force socket enables an inserted integrated circuit device to spring back somewhat while maintaining satisfactory electrical contact. This action is known as "pin wipe". In its preferred form, the present invention is particularly applicable to socketed PGA ICs, and more specifically, to PGA ICs intended for insertion in very low insertion force or zero insertion force PGA sockets.

Figure 3:
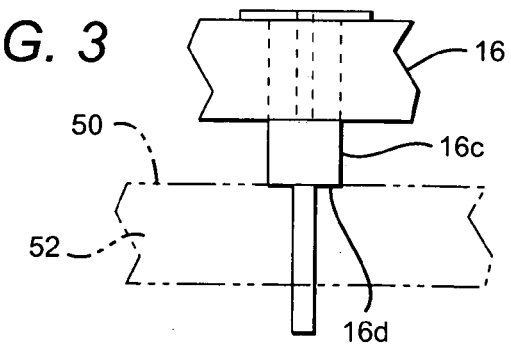
FIG. 3 is a side elevation view showing in greater detail a portion of an integrated circuit device socket forming part of a package utilized in embodiments of the invention.
Figure 2:
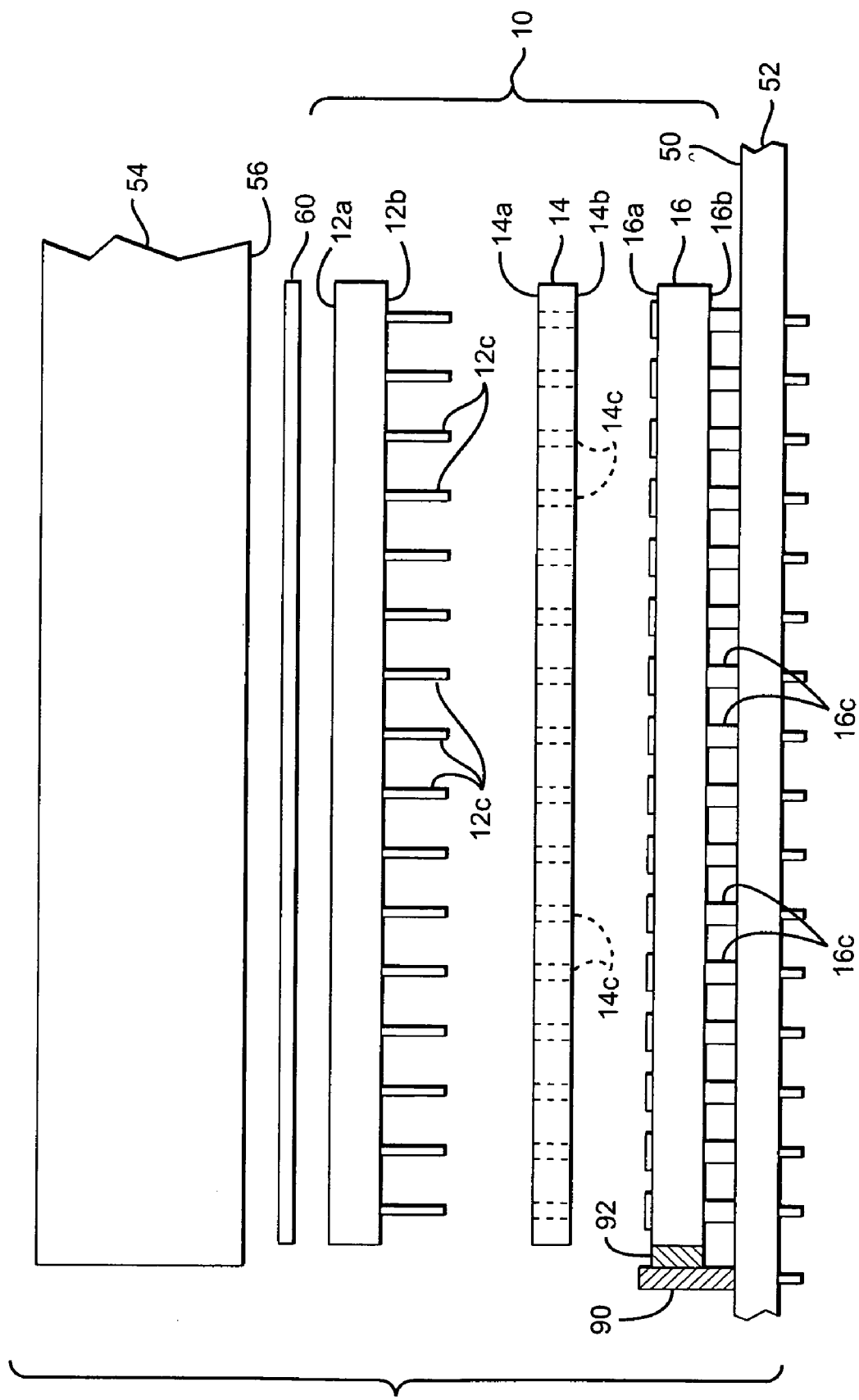
FIG. 2 is an exploded, side elevation view of a portion of a module in accordance with embodiments of the present invention.

FIG. 3 shows in greater detail the geometry of a typical pin-receiving contact receptacle 16c carried by the socket 16. The contact 16c defines a shoulder or flange 16d that engages the component surface 50 of the substrate 52 when the socket contacts have been inserted in corresponding holes in the substrate and the socket is in its nominal position. With the shoulders 16d of all of the contacts 16c in engagement with the component surface 50, the major surfaces 16a and 16b of the socket will be parallel with the component surface, as shown in FIG. 2.

The components of the IC packages 20, 30 and 40 are identical to those of the package 10 and the reference numeral pattern used to describe the package 10 applies to the remaining packages. Thus, for example, as best seen in FIG. 4, the IC package 20 comprises an IC device 22 having upper and lower surfaces 22a and 22b, respectively; a compliant layer 24 with upper and lower surfaces 24a and 24b; and a PGA socket 26 having upper and lower surfaces 26a and 26b, and pin contact receptacles 26c.

Overlying the upper surfaces of the IC packages 10, 20, 30 and 40 is a single heat sink 54, as shown in FIG. 1, that is common to all of the IC packages. The heat sink 54 has a lower surface 56 confronting the upper surfaces 12a, 22a, etc., of the IC packages. Details of the heat sink 54, as shown in FIG. 1, have not been shown as it will be understood that this element is fabricated of a material that has superior heat conductivity, for example, a length of extruded or machined aluminum or aluminum alloy, machined copper, or the like, typically including an array of efficient heat-dissipating projections such as fins.

Although the lower surface 56 of the heat sink 54 may be placed in direct contact with the upper surfaces 12a, 22a, 32a and 42a of the IC packages 10, 20, 30 and 40, the interposition of a thin thermal interface (of the kind described earlier) between each of the IC packages and the heat sink surface 56 is preferred. As mentioned, when hot, these thermal interfaces flow into and fill the minute irregularities in the confronting heat sink/IC package surfaces thereby improving heat transfer efficiency. Accordingly, thin thermal interfaces 60, 62 and 64 are shown in FIGS. 1, 2, 4 and 5 placed between the heat sink surface 56 the upper surfaces 12a, 22a and 42a of the IC devices 10, 20 and 40, respectively. A similar interface (not shown) is placed between the heat sink surface 56 and the IC package 30. One of the advantages of the coplanarity provided by embodiments of the present invention is that because the thermal interfaces between the heat sink and the IC devices do not function as compliance layers, they can be very thin (for example, 0.003 inch thick) so that their thermal impedance is not significant.

Further in accordance with expedients well known in the art, the module 8 may include a clamping or compression mechanism 70 (shown schematically in the drawings) coupling the heat sink 54 and a bolster or backing plate 72 (also shown schematically) underneath the substrate 52 for applying a predetermined clamping load, typically under spring load, to the stacked components of the IC packages to ensure the maintenance of reliable electrical contact between the IC devices and their respective sockets and to provide an efficient heat dissipation path from the IC device to the heat sink. An example of a suitable clamping mechanism is disclosed in U.S. Pat. Ser. No. 6,061,235 issued May 9, 2000, to Cromwell, et al., and assigned to the owner of the present invention. The '235 patent is incorporated herein by reference for its teaching of such a mechanism.

The compliance layers, such as the layers 14, 24 and 44 are compressed under the load imposed by the clamping mechanism 70 through the heat sink 54. The compliance layer material, examples of which are set out above, is such that it can be compressed to a limited extent, for example, up to about 0.040 inch. The compliance layers will resist compression as they try to revert to their uncompressed states. The clamping mechanism will squeeze the elastomeric compliance layers until the layers impose a counter-balancing reactive force.

It will thus be seen that the compliance layers can compensate for any non-coplanarity of the upper surfaces of the various IC packages produced by the usual dimensional tolerances occurring in the fabrication of the components of each package as well as any non-coplanarity resulting from variations from nominal in the positions of the sockets relative to the substrate. Among other advantages, the compliance layers enable the use of very thin, efficient thermal interfaces between the IC packages and the heat sink.

Examples of the manner in which non-coplanarities due to socket positioning variations are dealt with will be described with the aid of FIGS. 4 and 5. In these examples, it is assumed that the socket 16 of the IC package 10 is affixed in its nominal position relative to the substrate 52, as shown in FIGS. 2, 4 and 5; the socket 26 of the IC package 20 is slightly tilted so that one of its edges 26e is higher than an opposite edge 26f relative to the substrate surface 50 (FIGS. 1 and 4); the socket 36 of the IC package 30 is tilted about two axes relative to the substrate so that one corner 36e of the socket 36 is higher than a diagonally opposite corner 36f (FIG. 1); and the socket 46 of the fourth IC package 40 is affixed to the substrate in a position that is higher than nominal although the major surfaces 46a and 46b of the socket 46 are parallel with the component surface 50 of the substrate (FIG. 5). The foregoing only constitute some examples of the potential non-coplanarities that may result from variations in the installation of the IC package sockets and for which compensation is provided by embodiments of the present invention.

As seen in FIG. 4, a side elevation view showing the packages 10 and 20 in greater detail, the single axis tilt of the socket 26 is compensated for by the compliance layer 24 whose thickness 24d along its left edge (as seen in FIG. 4) is correspondingly less than its thickness 24e along the right edge. As noted, the IC package 10 in FIG. 4 is in a nominal position relative to the substrate. In the end elevation view of FIG. 5, there is again shown the IC package 10 whose socket 16 is nominally positioned as well as the adjacent IC package 40 whose socket 46 has been secured to the substrate in a higher-than-nominal position by a uniform offset 80. This positional offset of the socket 46 results in a correspondingly greater, albeit uniform, compression of the compliance layer 44 to a final thickness 44d.

The manner in which compensation is provided for the two-axis tilt of the socket of the IC package 30 will be evident from the treatment of the single-axis tilt of the socket 26 of the package 20, shown in FIG. 4.

Accordingly, the upper surfaces of the IC packages will be coplanar so that no gaps exist in the thermal interfaces between the packages and the heat sink common to them.

Figure 6:
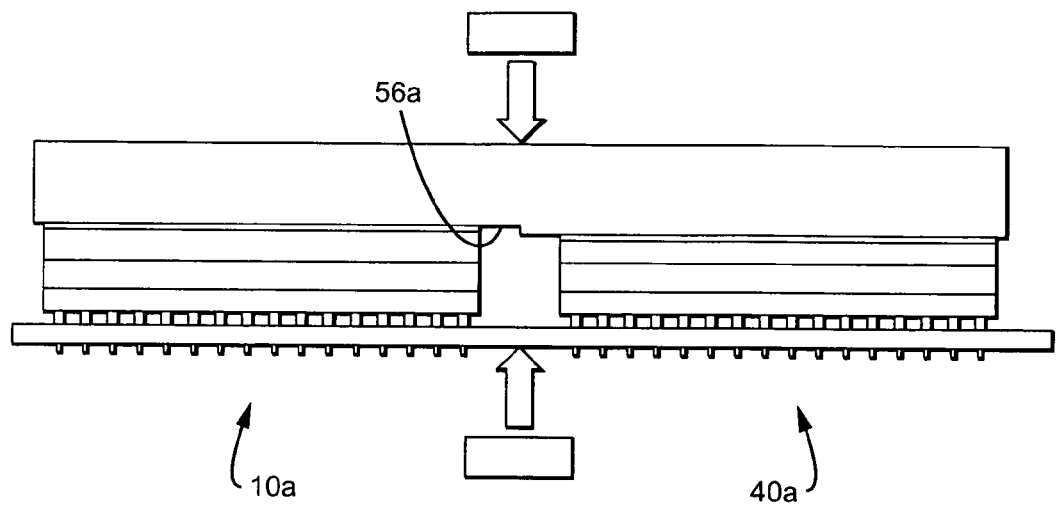
FIG. 6 is a side elevation view of a multiple IC package module in accordance with another variation of the invention.
Figure 7:
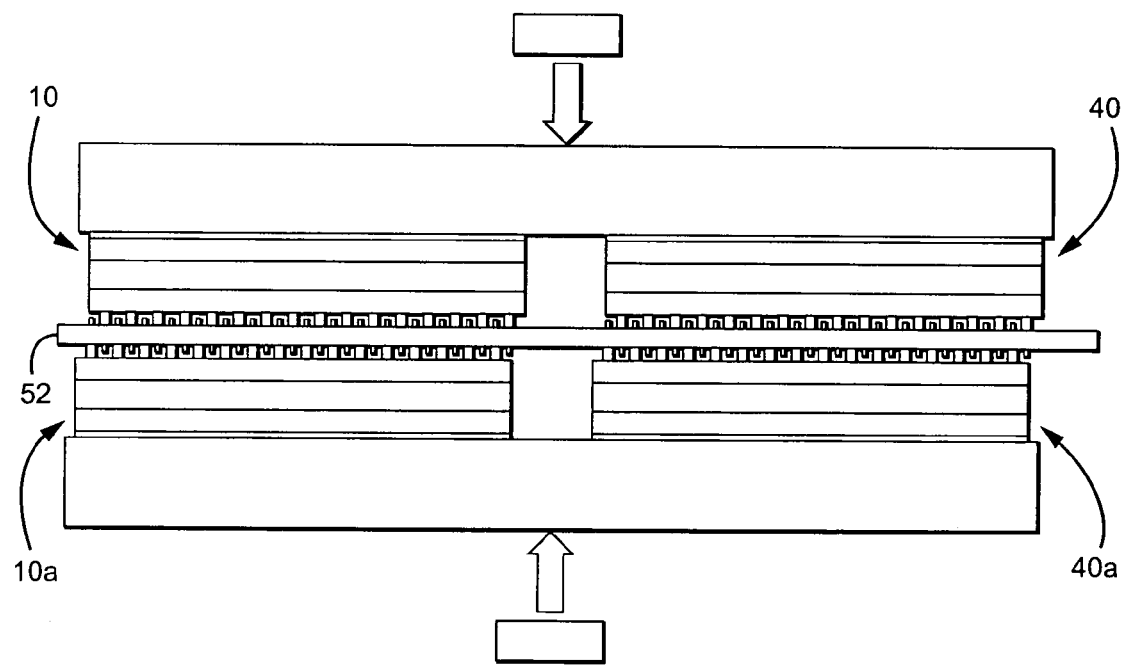
FIG. 7 is a side elevation view of a multiple IC package module in accordance with yet another variation of the invention.

Other variations of the invention will suggest themselves to those skilled in the art. For example, an electrically conductive peripheral strip 90 on the substrate 52 could be provided in contact with a corresponding strip 92 on the sockets to provide a Faraday cage. (FIG. 2.) Further, if integrated circuit packages having substantially different nominal heights are utilized, the lower surface of the heat sink could be stepped to accommodate those different heights. FIG. 6 shows a heat sink comprising a lower surface having a step 56a for accommodating integrated circuit packages 10a and 40a having substantially different heights. Still further, it will be evident that the teachings of the invention are equally applicable to double-sided assemblies comprising IC packages mounted on both sides of a substrate. FIG. 7 shows a double-sided assembly comprising IC packages 10 and 40 mounted on one side of the substrate 52 and IC packages 10a and 40a mounted on the other side of the substrate.

What is claimed is:

1. A multiple integrated circuit (IC) package module comprising:
   a plurality of IC devices inserted in associated sockets mounted on a substrate, each IC device having opposed, major surfaces, one of the major surfaces of each device confronting the socket into which the device is inserted;
   a compressible compliance layer interposed between the one major surface of each IC device and the associated socket into which the IC device is inserted; and
   a single heat sink having a surface in heat transfer relationship with the other of the major surfaces of the IC devices.

2. The module of claim 1 in which:
the IC devices and the sockets comprise pin grid array interconnect components.

3. The module of claim 1 which further comprises:
a thermal interface interposed between the other major surface of each IC device and the surface of the heat sink for transferring heat generated by the IC devices to the heat sink.

4. The module of claim 3 in which:
the thermal interface comprises a thin layer of material having a high thermal conductivity.

5. The module of claim 1 in which the module further comprises:
a mechanism operatively associated with the heat sink and the substrate for urging the heat sink and the substrate toward each other and compressing the compliance layers.

6. The module of claim 1 in which:
each of the compliance layers comprises an elastomeric material.

7. The module of claim 1 in which:
at least one compliance layer is made of an electrically insulative material.

8. The module of claim 1 in which:
at least one compliance layer is made of a non-heat-conductive material.

9. The module of claim 1 in which:
at least one socket comprises a low insertion force PGA socket.

10. The module of claim 1 in which:
at least one socket comprises a zero insertion force PGA socket.

11. The module of claim 1 in which:
said surface of said heat sink is stepped to accommodate differences in the heights of said IC devices.

12. The module of claim 1 in which:
the substrate comprises opposed, major surfaces; and which module further comprises:
a plurality of IC devices inserted in associated sockets mounted on each major surface of said substrate.

13. A multiple integrated circuit (IC) package module comprising:
a plurality of IC devices inserted in associated sockets mounted on a substrate, each IC device having opposed, upper and lower surfaces, the lower surface of each device confronting the socket into which the device is inserted;
a compressible compliance layer interposed between the lower surface of each IC device and the associated socket into which the IC device is inserted; and
a single heat sink having a surface in heat transfer relationship with the upper surfaces of the IC devices, and wherein, in response to a clamping force applied to the heat sink, the compressible compliance layer is adapted to compensate for non-coplanarity of the upper surfaces of the plurality of IC devices.

14. The module of claim 13 in which:
the IC devices each comprise an array of interconnect pins projecting from the lower surface of the device through corresponding apertures in the compliance layer and into corresponding contact receptacles associated with the socket.

15. The module of claim 13 in which:
the IC devices and the sockets comprise pin grid array interconnect components.

16. The module of claim 13 which further comprises:
a thermal interface interposed between the upper surface of each IC device and the surface of the heat sink for transferring heat generated by the IC devices to the heat sink.

17. The module of claim 16 in which:
the thermal interface comprises a thin layer of material having a high thermal conductivity.

18. The module of claim 13 in which the module further comprises:
a mechanism operatively associated with the heat sink and the substrate for urging the heat sink and the substrate toward each other and compressing the compliance layers.

19. The module of claim 13 in which:
each of the compliance layers comprises an elastomeric material.

20. The module of claim 13 in which:
at least one compliance layer is made of an electrically insulative material.

21. The module of claim 13 in which:
at least one compliance layer is made of a non-heat-conductive material.

22. The module of claim 13 in which:
at least one socket comprises a low insertion force PGA socket.

23. The module of claim 13 in which:
at least one socket comprises a zero insertion force PGA socket.

24. The module of claim 13 in which:
said surface of said heat sink is stepped to accommodate differences in the heights of said IC devices.

25. The module of claim 13 in which:
the substrate comprises opposed, major surfaces; and which module further comprises:
a plurality of IC devices inserted in associated sockets mounted on each major surface of said substrate.

* * * * *